United States Patent
Cheek et al.

(10) Patent No.: US 7,901,980 B2
(45) Date of Patent: *Mar. 8, 2011

(54) SELF-ALIGNED IN-CONTACT PHASE CHANGE MEMORY DEVICE

(75) Inventors: Roger W. Cheek, Somers, NY (US); Chung H. Lam, Peekskill, NY (US); Stephen M. Rossnagel, Pleasantville, NY (US); Alejandro G. Schrott, New York, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

This patent is subject to a terminal disclaimer.

(21) Appl. No.: 12/537,317

(22) Filed: Aug. 7, 2009

(65) Prior Publication Data
US 2009/0298223 A1 Dec. 3, 2009

Related U.S. Application Data

(62) Division of application No. 11/550,318, filed on Oct. 17, 2006.

(51) Int. Cl.
*H01L 21/06* (2006.01)

(52) U.S. Cl. .......... 438/102; 438/103; 257/E21.069; 257/E21.075

(58) Field of Classification Search .......... 257/2–5, 257/E45.002–3, E21.069, 75; 438/102–103
See application file for complete search history.

(56) References Cited

U.S. PATENT DOCUMENTS

| 2005/0035342 A1* | 2/2005 | Chen ................... 257/2 |
| 2008/0017894 A1* | 1/2008 | Happ et al. .......... 257/246 |

* cited by examiner

*Primary Examiner* — Wael M Fahmy
*Assistant Examiner* — Minchul Yang
(74) *Attorney, Agent, or Firm* — Ido Tuchman; Avzken Alexanian

(57) ABSTRACT

A memory cell and a method of making the same, that includes insulating material deposited on a substrate, a bottom electrode formed within the insulating material, a plurality of insulating layers deposited above the bottom electrode and at least one of which acts as an intermediate insulating layer. Then defining a via in the insulating layers above the intermediate insulating layer, creating a channel for etch with a step spacer, defining a pore in the intermediate insulating layer, removing all insulating layers above the intermediate insulating layer, filling the entirety of the pore with phase change material, and forming an upper electrode above the phase change material. Additionally, the formation of bit line connections with the upper electrode.

8 Claims, 12 Drawing Sheets

SELF-ALIGNED IN-CONTACT PHASE CHANGE MEMORY DEVICE

CROSS-REFERENCE TO RELATED APPLICATIONS

This application is a divisional application claiming priority under 35 U.S.C. §120 to U.S. patent application Ser. No. 11/550,318 filed Oct. 17, 2006, the entire text of which is specifically incorporated by reference herein.

FIELD OF THE INVENTION

The present invention is directed toward computer memory, and more particularly to a non-volatile phase change memory device.

BACKGROUND OF THE INVENTION

There are two major groups in computer memory: non-volatile memory and volatile memory. Constant input of energy in order to retain information is not necessary in non-volatile memory but is required in the volatile memory. Examples of non-volatile memory devices are Read Only Memory, Flash Electrical Erasable Read Only Memory, Ferroelectric Random Access Memory, Magnetic Random Access Memory, and Phase Change Memory. Examples of volatile memory devices include Dynamic Random Access Memory (DRAM) and Static Random Access Memory (SRAM). The present invention is directed to phase change memory. In phase change memory, information is stored in materials that can be manipulated into different phases. Each of these phases exhibit different electrical properties which can be used for storing information. The amorphous and crystalline phases are typically two phases used for bit storage (1's and 0's) since they have detectable differences in electrical resistance. Specifically, the amorphous phase has a higher resistance than the crystalline phase.

Glass chalcogenides are a group of materials commonly utilized as phase change material. This group of materials contain a chalcogen (Periodic Table Group 16/VIA) and a more electropositive element. Selenium (Se) and tellurium (Te) are the two most common semiconductors in the group used to produce a glass chalcogenide when creating a phase change memory cell. An example of this would be $Ge_2Sb_2Te_5$ (GST), SbTe, and $In_2Se_3$. However, some phase change materials do not utilize chalcogen, such as GeSb. Thus, a variety of materials can be used in a phase change material cell as long as they can retain separate amorphous and crystalline states.

The amorphous and crystalline phases in phase change material are reversible. As shown in FIG. 1, this is achieved by forming a via 104 lined with insulating material 106. A lower electrode 102 (also referred to as the source) is formed below the phase change material 107 and an upper electrode 101 (also referred to as the drain) is formed above the phase change material 107. This allows an electrical pulse to travel through the phase change material when electricity is applied from the source 102 to the drain 101. Due to ohmic heating, the phase change material 107 changes its phase. A relatively high intensity, short duration current pulse with a quick transition at the trailing edge results in the phase change material 107 melting and cooling quickly. The phase change material 107 does not have the time to form organized crystals, thereby creating an amorphous solid phase. A relatively low intensity, long duration pulse allows the phase change material 107 to heat and slowly cool, thus crystallizing into the crystalline phase. It is possible to adjust the intensity and duration of the pulses to produce a varying degree of resistance for multi-bit storage in a memory cell.

A phase change cell is read by applying a pulse of insufficient strength to program, i.e. to alter the phase of, the material 107. The resistance of this pulse can then be read as a "1" or "0". The amorphous phase which carries a greater resistance is generally used to represent a binary 0. The crystalline phase which carries a lower resistance can be used to represent a binary 1. In cells where there are varying degrees of resistance, the phases can be used to represent, for example, "00", "01", "10", and "11".

BRIEF SUMMARY OF THE INVENTION

One exemplary aspect of the present invention is a method of forming a memory cell. The method includes forming at least one insulating layer over a substrate, a via in the insulating layer, and a conductive lower block in the via. A step spacer of insulating material is formed in the via above the conductive lower block. The step spacer includes a passage with a bottom aperture and a top aperture, such that the bottom aperture is smaller than the top aperture. Phase change material is deposited in the via above the conductive lower block and within the step spacer. A conductive upper block is formed over the phase change material.

Another exemplary aspect of the invention is a memory cell. The memory cell includes a substrate and an insulating material formed over the substrate. A via is formed within the insulating material. The memory cell includes a conductive lower block at the bottom of the via and a step spacer. The step spacer is made of insulating material, is disposed over the conductive lower block, and includes a passage. Phase change material is disposed above the conductive lower block and within the step spacer. A conductive upper block is disposed above the phase change material.

Yet a further exemplary aspect of the invention is an integrated circuit including one or more memory cells. At least one of the memory cells includes a substrate, an insulating material formed over the substrate with a via formed therein, a conductive lower block at the bottom of the via, and a step spacer made of insulating material disposed over the conductive lower block. The step spacer includes a passage. Phase change material is disposed above the conductive lower block and within the step spacer. A conductive upper block is disposed above the phase change material.

DETAILED DESCRIPTION OF THE INVENTION

Figure 1:
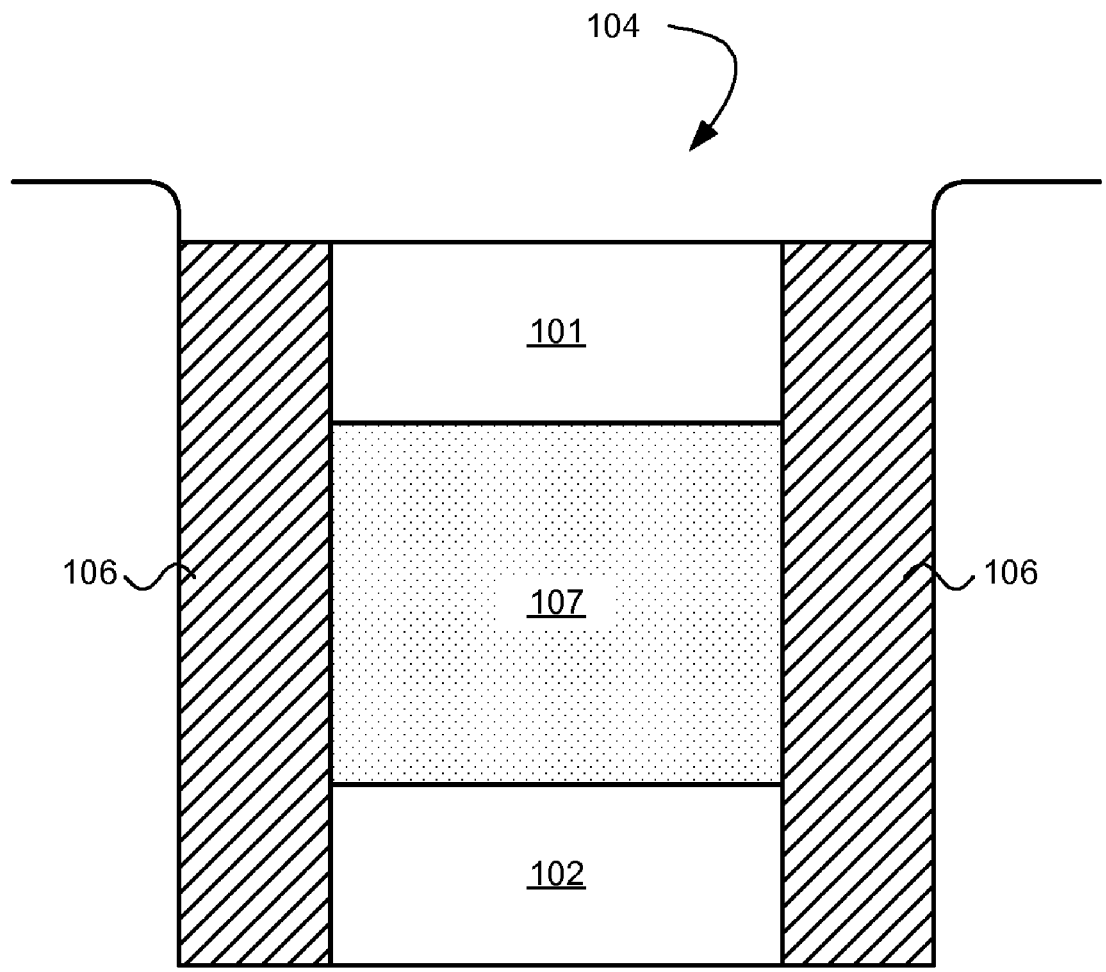
FIG. 1 is a cross sectional view of a memory cell of the present invention.

The present invention will be described with reference to embodiments of the invention. Throughout the description of the invention reference is made to FIGS. 1-9. When referring to the figures, like structures and elements shown throughout are indicated with like reference numerals.

Figure 2:
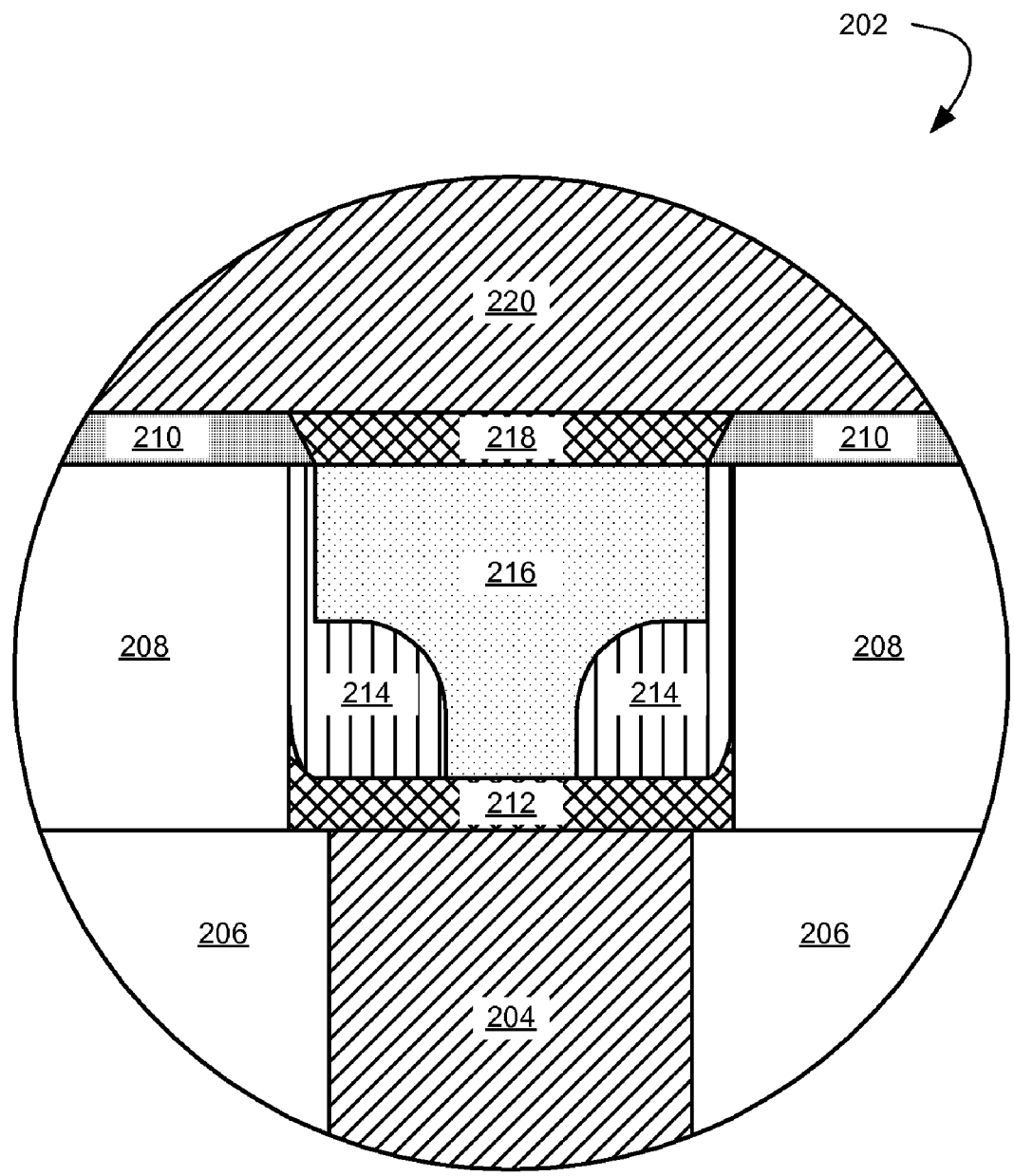
FIG. 2 is a cross sectional view of a FEOL wafer with insulating layers.

FIG. 2 illustrates a cross sectional view of an exemplary memory cell 202 contemplated by the present invention. The memory cell 202 includes a conductive lower block 204 in a via in at least one layer of insulating material 206, 208 and 210, a heat-isolating conductive lower layer 212 above the conductive lower block 204, an insulating step spacer 214 above the heat-isolating conductive lower layer 212, phase change material 216 disposed above the heat-isolating conductive lower layer 212 and within the step spacer 214, a heat-isolating conductive upper layer 218, and a conductive upper block 220. The cell 202 is typically formed on a substrate with metal-oxide-semiconductor field-effect transistors (MOSFETs) (not shown). Other transistors known to those skilled in the art, such as junction FETs and bipolar junction transistors, may be used with the present invention.

Figure 3A:
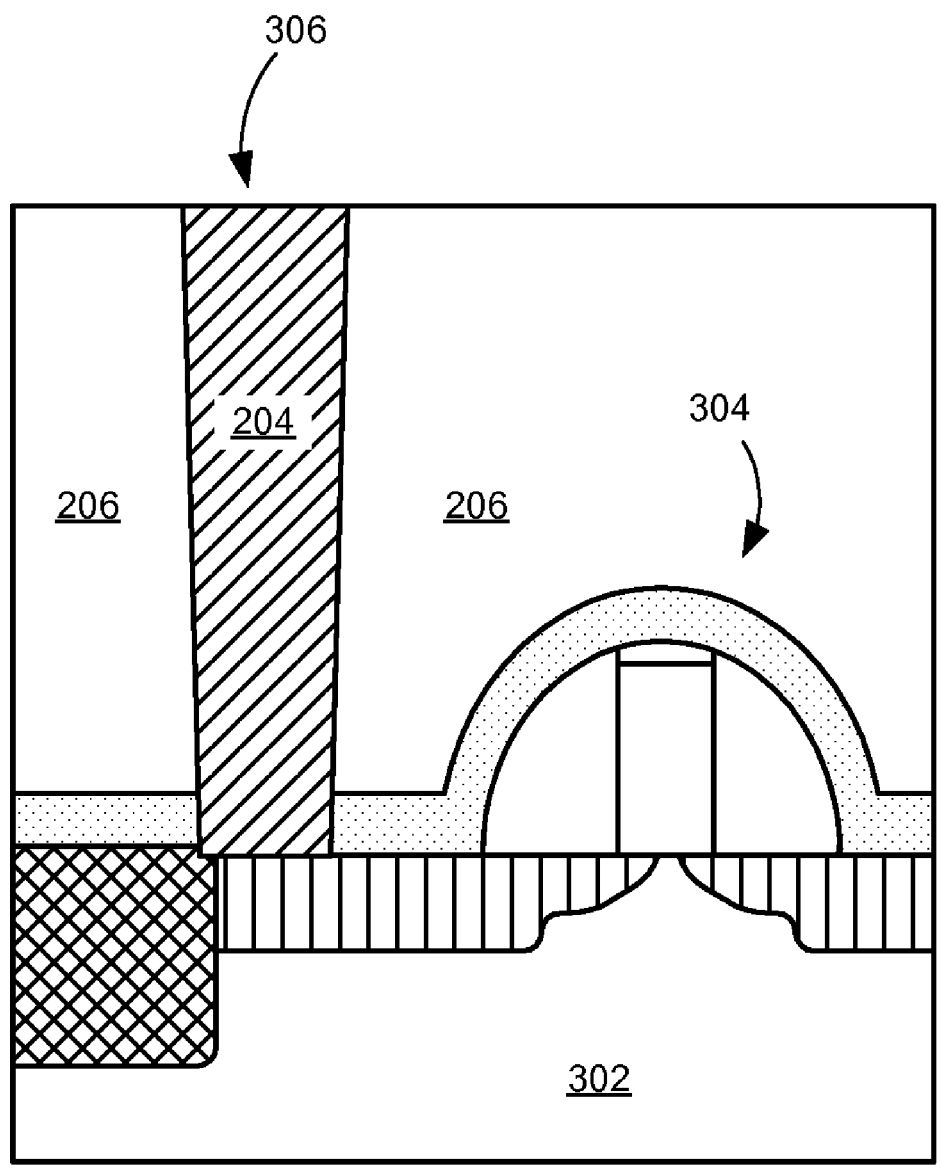
FIG. 3 is a cross sectional view of the creation of a via and undercut in the insulating layers.
Figure 3B:
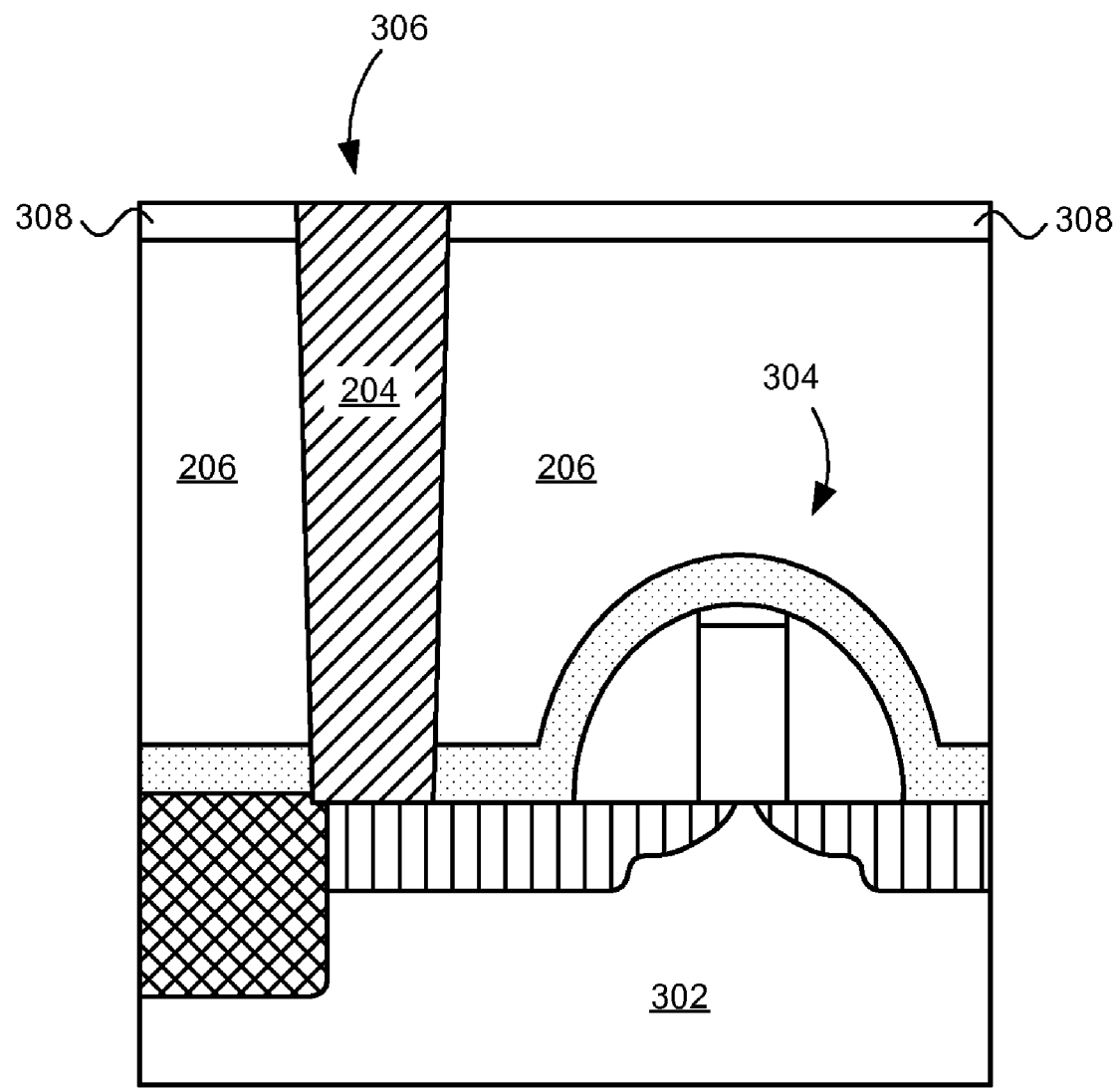

FIG. 3A and FIG. 3B are two separate embodiments of starting front end of line (FEOL) wafers where the insulating material, the transistor, the via, and the conductive lower block have already been formed on a substrate. The first embodiment, shown in FIG. 3A, is a FEOL wafer comprised of a substrate 302, MOSFET 304, an insulating material 206 comprised of, but not limited to, silicon dioxide ($SiO_2$), and a via 306 formed in the insulating material 206 with a conductive lower block 204 comprised of, but not limited to, tungsten (W) formed therein. The typical depth of the via 204 is 500 nm for a 180 nm CMOS technology.

Typically, the substrate 302 is composed of silicon monocrystals, however, some III-V compounds of the periodic table such as gallium arsenide (GaAs) or other compounds may be utilized. It is contemplated that substitute insulating materials may be employed in the present invention, such as SiOC or various other dielectric materials known by those skilled in the art.

FIG. 3B is an alternate embodiment of a FEOL wafer. This alternate FEOL wafer is also comprised of the substrate 302, the MOSFET 304, a first insulating layer 206, a second insulating layer 308, and the via 306. The conductive lower block 302 is formed within the via 306. The insulating material is comprised of a $SiO_2$ base layer 206 and a thinner layer of silicon nitride ($Si_3N_4$) 308 disposed above the $SiO_2$ base layer 206. $SiO_2$ and $Si_3N_4$ may be replaced with alternative insulators such as metals oxides, for example, $Al_2O_3$. The method in forming these structures (the insulating material 206 and 308, the MOSFET 304, the via 306, and the conductive lower block 204) is well known in the art and not described herein.

Figure 4A:
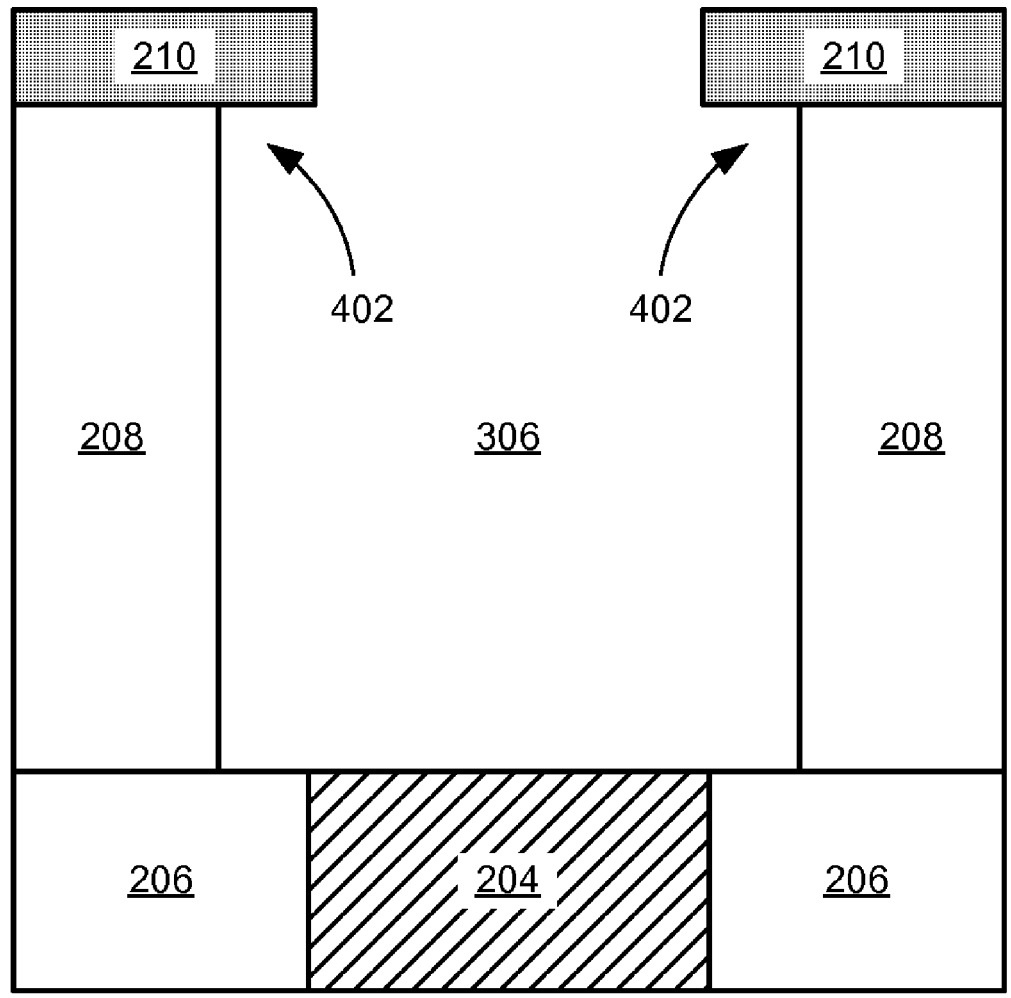
FIG. 4 is a cross sectional view illustrating the deposition of insulating material into the via.

Starting with the structure shown in FIG. 3A and turning to FIG. 4A, forming an undercut is achieved by forming a first insulating layer 208 comprised of, but not limited to, $SiO_2$ over the FEOL wafer. Next, a second insulating layer 210 is formed comprised of, but not limited to, $Si_3N_4$ over the first insulating layer. Both $SiO_2$ and $Si_3N_4$ can be formed in one plasma enhanced chemical vapor deposition (PECVD) chamber sequentially or formed separately. Photo resist (not shown) is then applied with a mask so that the insulating layers 208 and 210 above the via 306 and conductive lower block 204 are exposed for an etch. The insulating layers 208 and 210 are then etched down to the conductive lower block 204, thereby creating an extension of the via 306. The photo resist is then stripped and the insulating layer is etched with hydrofluoric acid (HF). HF attacks $SiO_2$ more rapidly than $Si_3N_4$, creating the undercut 402 necessary for producing a T-shaped passage with respect to a center axial cross-section within the step spacer.

Figure 4B:
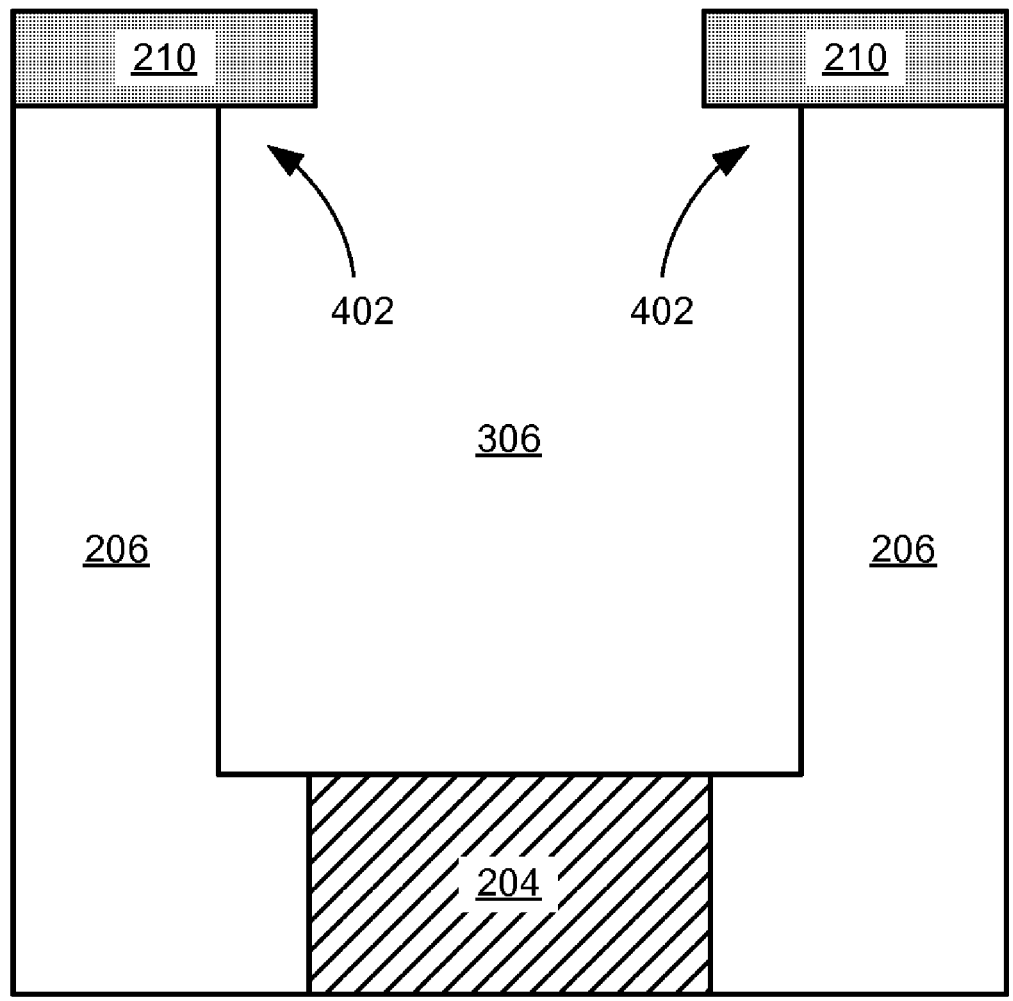

In the alternate embodiment of a starting FEOL wafer shown in FIG. 3B, forming the undercut 402 shown in FIG. 4B is achieved by applying photo resist so that it exposes the via 306 and conductive lower block 204. The conductive lower block 204 is then recessed into the via 306 with a tungsten etch. The tungsten etch can be performed with either, but not limited to, an acid bath or with a reactive-ion etch (RIE), both are well-known in the art. The photo resist is then stripped and the insulating layer is etched with HF. Again this produces an undercut 402 within the insulating layer 206 forming the walls of the via 306. Note that the end products are similar where the insulating layers 208 and 210 in FIG. 4A are reduced to insulating layer 206 in FIG. 4B.

Figure 5:
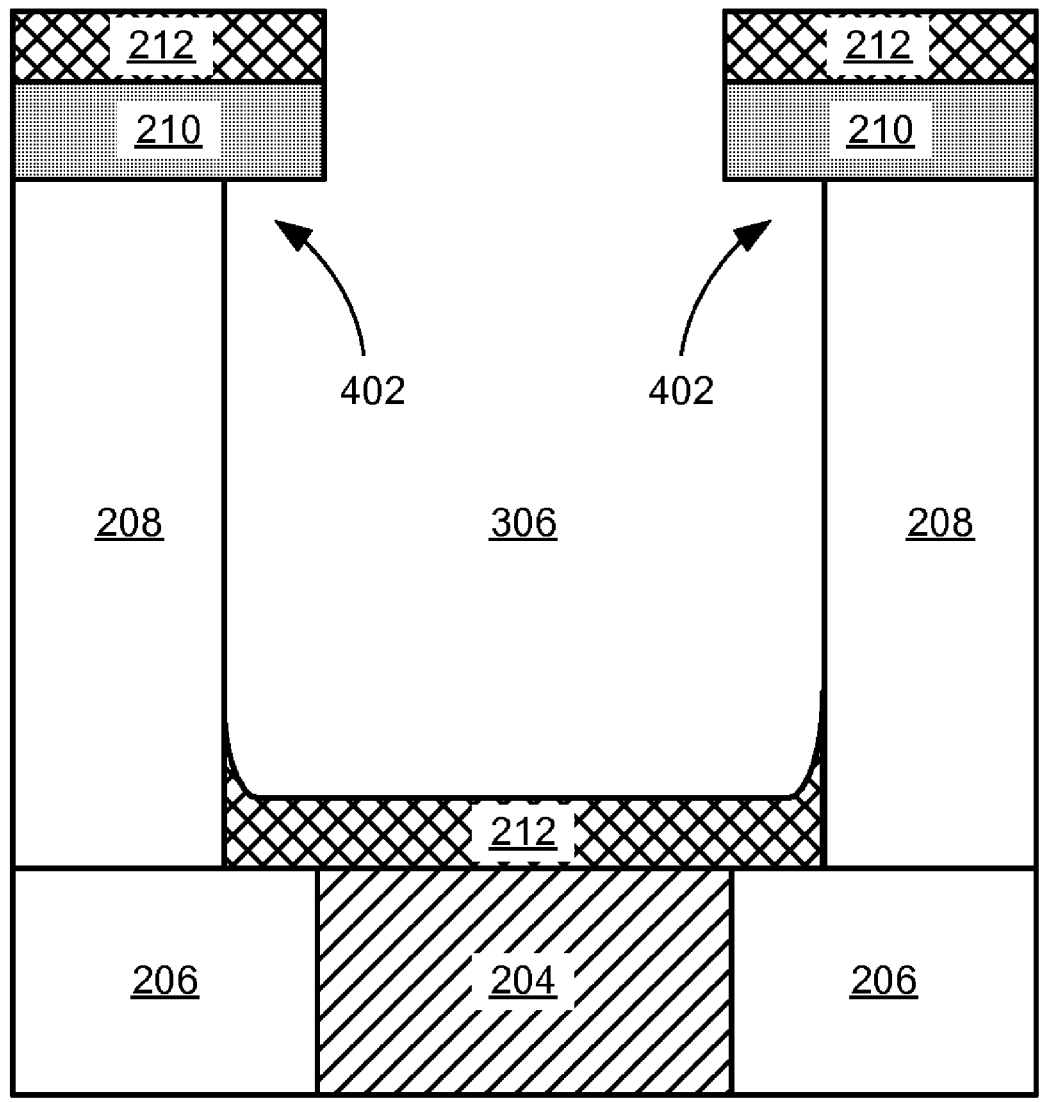
FIG. 5 is a cross sectional view of the creation of a step spacer.

As shown in FIG. 5, the heat-isolating conductive lower layer 212 is then sputtered onto the structure (sputter deposition is well known in the art). Sputter deposition is anisotropic such that deposition on sidewall is avoided. The lower conductive heat-isolating layer 212 is comprised of a barrier metal or conductive ceramic. Within this exemplary embodiment the heat-isolating conductive lower layer 212 is comprised of, but not limited to, a 20 nm layer of TiN, a conductive ceramic. The TiN adheres to the top of the conductive lower block 204 and the lower sidewalls of the via 206. The TiN acts as a thermal insulator isolating the heat required to program the cell substantially to the phase change material (not shown). The thickness of this heat-isolating layer 212 can vary within alternate embodiments of the invention; a range of 20-50 nm of heat-isolating conductive material has been contemplated. Other barrier metals and conductive ceramics may include cobalt (Co), tantalum (Ta), tantalum nitride (TaN), tantalum silicon nitride (TaSiN), ruthenium (Ru), and combinations thereof.

Figure 6:
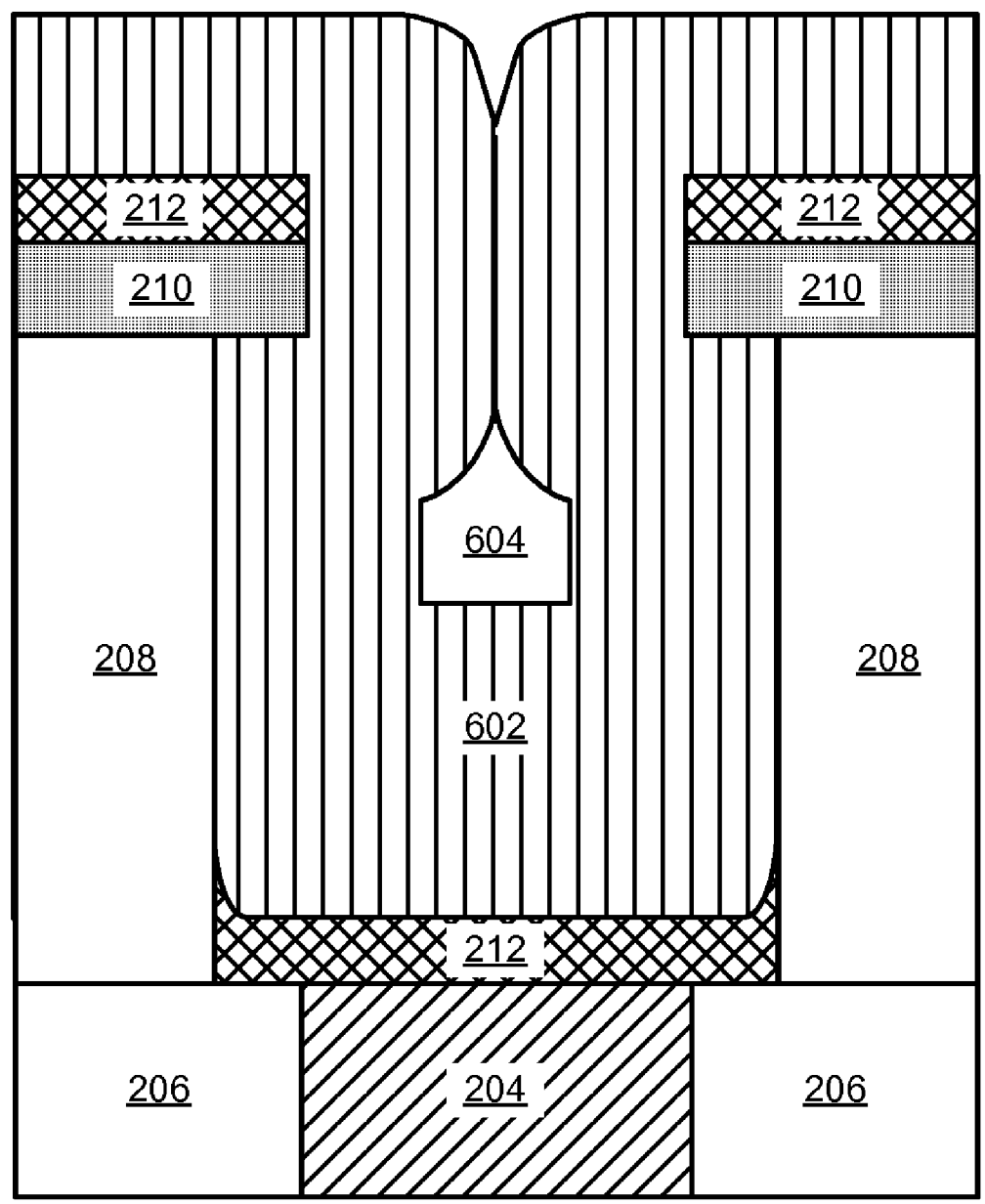
FIG. 6 is a cross sectional view of the creation of a pore.

In FIG. 6, a conformal insulating material 602, $SiO_2$ in one embodiment, is formed over the lower conductive heat-isolating layer 212 and into the via. The thickness of the insulating material 602 used to form the step spacer must be of a greater thickness than the radius of the via. This forms a cavity 604 within the insulating material 602 used to form the step spacer (not shown). Thus, the conformality of deposition of the insulating material 602 is such that a cavity is formed. Furthermore, the cavity formation is facilitated by the creation of a reentrant profile of the via prior to the deposition of the insulating spacer layer, as shown. As mentioned above, the reentrant profile can be created by forming a first insulating layer over the conductive lower block, forming a second insulating layer over the first insulating layer, and etching the first and second insulating layers such that the second insulating layer overhangs the first insulating layer.

In a particular embodiment, the via has a radius of 90 nm and 100 nm of insulating material 602 is used. The insulating material thickness will vary in alternate embodiments with larger or smaller via diameters. The degree of undercut in the $SiO_2$ of the insulating layer 208 correlates to the size of the cavity 604 formed within the insulating material 602. The diameter of the cavity 604 is approximately twice the size of the undercut (i.e. 30 nm of undercut creates a 60 nm diameter cavity) of the $SiO_2$ 208 under the $Si_3N_4$ 210. The diameter of the cavity is independent of the diameter of the via 306 at the top insulating layer 210.

Figure 7:
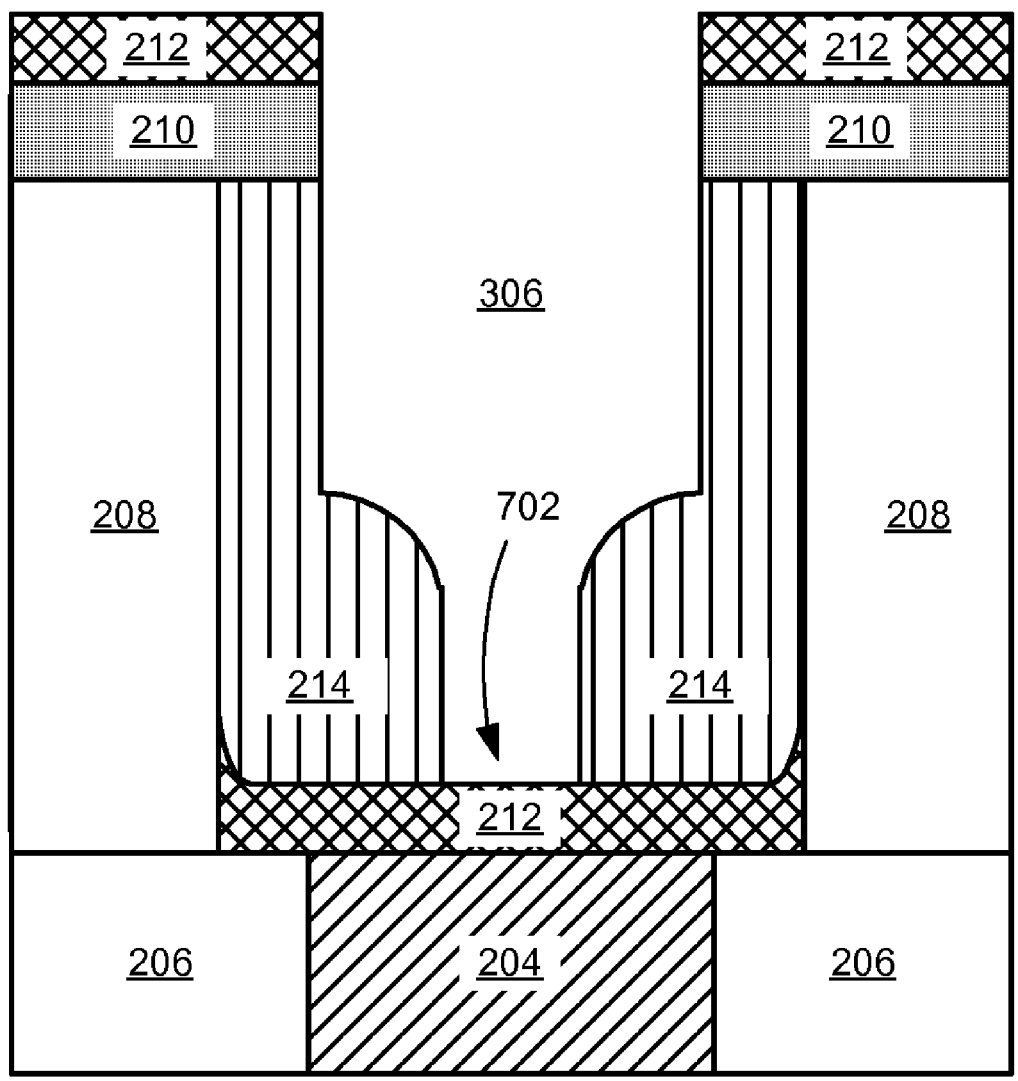
FIG. 7 is a cross sectional view illustrating the removal of the insulating layers

In FIG. 7, the step spacer 214 is formed by anisotropic selective plasma reactive ion etch, wherein the etch removes all the insulating material above the heat-isolating conductive layer 212 on top of the $Si_3N_4$ layer of the insulating layer and then etches at least half way into the via 306 (to create the "step" in the step spacer). The amount of etch performed is relative to the scale of the embodiment. An example of an alternate embodiment would be a 180 nm diameter via which would require a deposition of approximately 100 nm of insulating material and an additional etch of 100 nm into a 200 nm deep via to form the "step" in the step spacer 214. The diameter of the cavity space from the insulating material is transferred to the top 702 of the heat-isolating conductive lower layer 212 and within the bottom aperture of the step spacer during this process of creating the step spacer 214. As illustrated in FIG. 7, the step spacer 214 has a center axial cross-section that is substantially T-shaped with the bottom aperture smaller than the top aperture and with the step approximately half way between the top of the via 306 and the heat-isolating conductive lower layer 212. The step spacer 214 helps maximize ohmic heating within the phase change material.

Figure 8:
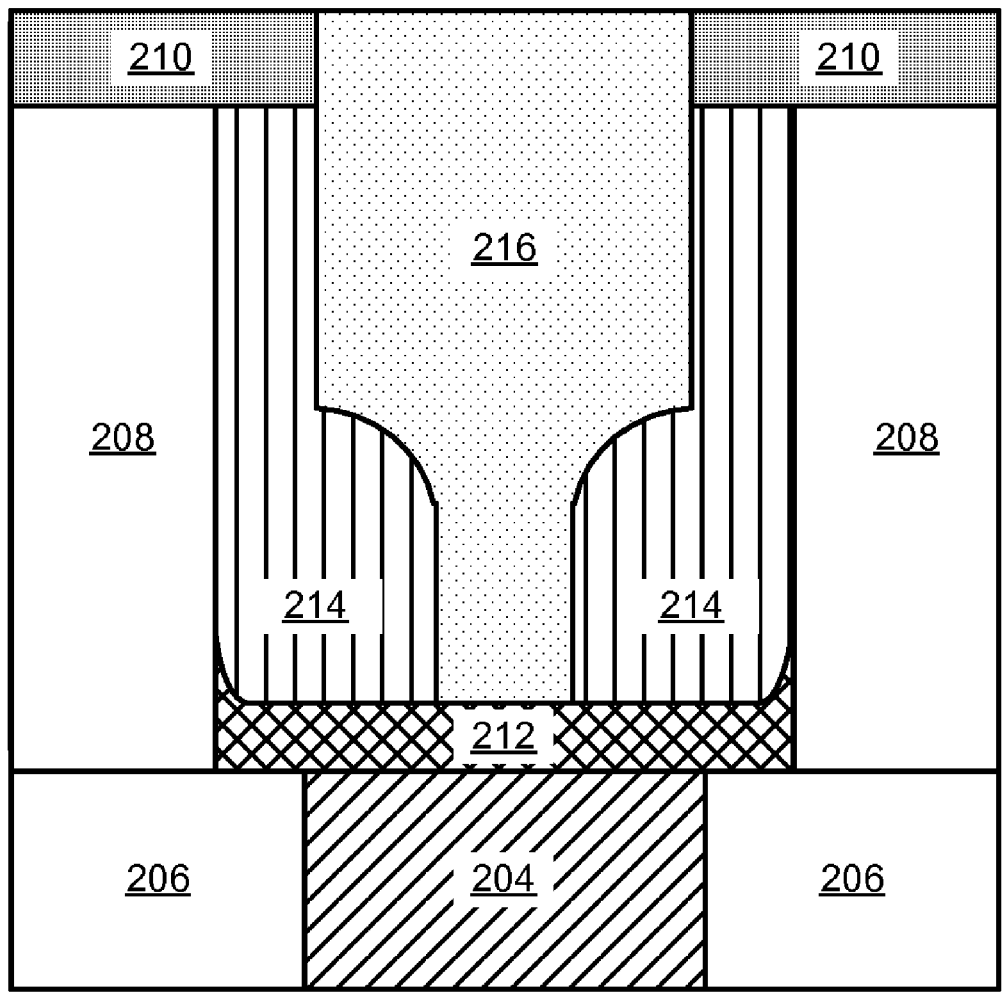
FIG. 8 is a cross sectional view illustrating the deposition of phase change material and an upper electrode.

As shown in FIG. 8, the phase change material 216 is deposited on the structure, in the via, above the heat-isolating conductive lower layer 212, and within the step spacer 214. The phase change material 216 can be comprised of a chalcogenide. In a particular embodiment of the invention, the chalcogenide used is, but not limited to, $Ge_2Sb_2Te_5$. Chalcogenides are comprised of a chalcogen (Periodic Table Group 16/Group VIA) and a more electropositive element. An example of alternate phase change materials would be GeSb, SbTe, etc. Excess phase change material and the remnants of the heat-isolating conductive layer 212 left over on the insulating layer surface are then removed by chemical mechanical polish (CMP) stopping on the $Si_3N_4$ surface of the insulating layer 210.

Figure 9A:
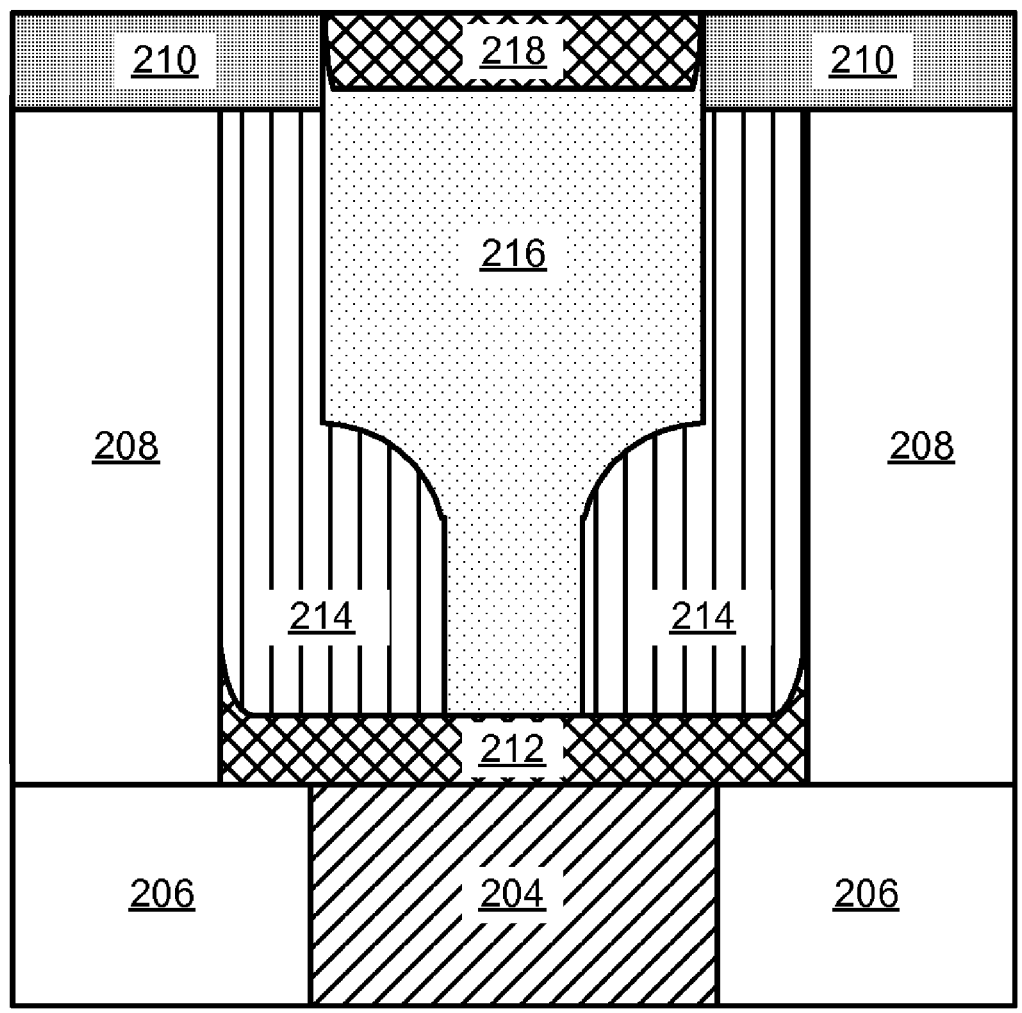
FIG. 9A is a cross sectional view of the memory cell after the phase change material is etched and recessed into the via.
Figure 9B:
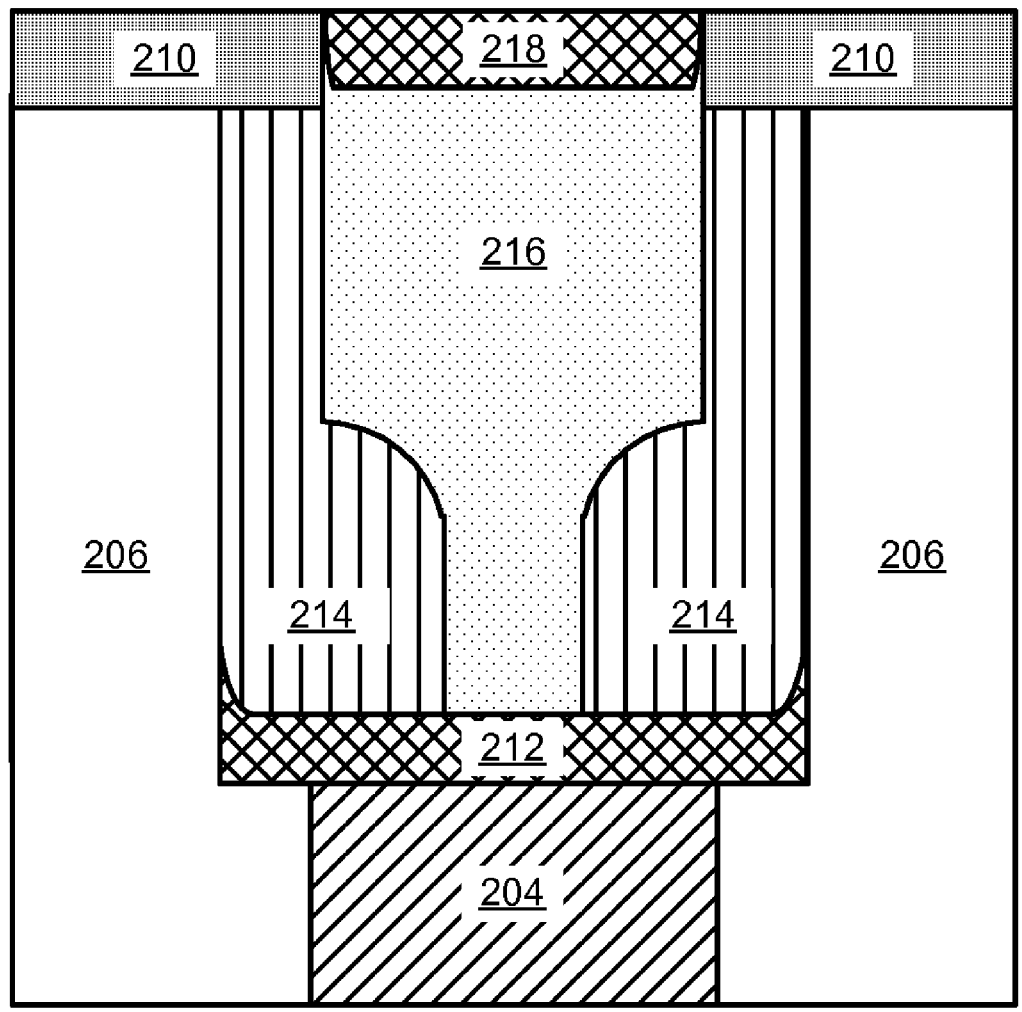
FIG. 9B is a cross sectional view illustrating an alternate embodiment resulting from the alternate starting FEOL wafer illustrated in FIGS. 3B and 4B.

Turning to FIG. 9A, the phase change material 216 is then etched so that it becomes recessed into the via. The heat-isolating conductive upper layer 218 comprised of, but not limited to, 20 nm of TiN is then deposited above the phase change material. The upper conductive heat-isolating layer 218 may be comprised of a barrier metal or conductive ceramic. Again, a range of 20-50 nm of heat-isolating conductive material is been contemplated. The excess TiN is then removed by CMP stopping on the Si3N4 surface of the insulating layer 210. FIG. 9B is a graphical representation of the alternate embodiment resulting from the alternate starting FEOL wafer illustrated in FIGS. 3B and 4B.

Returning to FIG. 2, the conductive upper block 220 may be comprised of, but not limited to, copper wiring deposited on the cell above the heat-isolating conductive upper layer 218. The copper (Cu) comprising the conductive upper block 220 can be replaced with other materials with high electrical conductivity such as, but not limited to, silver (Ag), gold (Au), tungsten (W), or aluminum (Al).

To program the cell 202, an electrical pulse is applied beginning at the conductive lower block 204, to the heat-isolating conductive lower layer 212, into the phase change material 216, to the heat-isolating conductive upper layer 218, and finally up to the conductive upper block 220. Ohmic heating created by the resistance through the phase change material 216 heats the same and changes the resistive properties of the phase change material 216. A short strong electrical pulse will cause the phase change material 216 to heat and cool quickly resulting in an amorphous phase. A long weaker electrical pulse will cause the phase change material to heat and cool slowly, thereby allowing the phase change material 216 to crystallize. The amorphous and crystalline phases exhibit, respectively, higher and lower resistive properties. The stored data can be retrieved through reading the resistance of a particular cell by producing an electrical pulse that is either too weak or too short to alter the phase in the phase change material 216.

The heat-isolating conductive lower and upper layers 212, 218 improve the efficiency of ohmic heating used to store information. The layers 212, 218 "cap" the phase change material and are contained within the vias of the memory cell. By "capping" the phase change material 216 the heat-isolating conductive layers 212, 218 provide insulation for the phase change material, thereby isolating the heat produced from the electrical resistance to the phase change material 216. The heat-isolating conductive layers 212, 218 can help improve memory cell efficiency and write times.

The production of an integrated circuit of cells is achieved by producing the cells in an array so that rows and columns are formed. These cells are then linked together at the FET gates in the MOSFET creating a "word" line. The wiring, used also as the conductive upper block, is linked together perpendicular to the FET gate linkage creating a "bit" line. This allows each cell to be read or programmed individually by mapping its "word" and "bit" line coordinates.

The description of the present invention has been presented for purposes of illustration and description, but is not intended to be exhaustive or limited to the invention in the form disclosed. Many modifications and variations will be apparent to those of ordinary skill in the art without departing from the scope and spirit of the invention. The embodiment was chosen and described in order to best explain the principles of the invention and the practical application, and to enable others of ordinary skill in the art to understand the invention for various embodiments with various modifications as are suited to the particular use contemplated. Having thus described the invention of the present application in detail and by reference to embodiments thereof, it will be apparent that modifications and variations are possible without departing from the scope of the invention defined in the appended claims.

That which is claimed is:

1. A method of forming a memory cell, the method comprising:
    forming at least one insulating layer over a substrate;
    forming a via in the insulating layer;
    forming a conductive lower block in the via;
    forming a step spacer of insulating material in the via above the conductive lower block, the step spacer including a passage with a bottom aperture and a top aperture, the bottom aperture being smaller than the top aperture;
    depositing phase change material in the via above the conductive lower block and within the step spacer;
    forming a conductive upper block over the phase change material; wherein forming the step spacer includes:
    depositing an insulating spacer layer within the via, the conformality of deposition of the insulating spacer layer being such that a cavity is formed by the insulating spacer layer; and
    etching the insulating spacer layer such that the area below the cavity forms a ridge within the step spacer.

2. The method of claim 1, further comprising recessing the conductive lower block.

3. The method of claim 1, further comprising depositing a heat-isolating conductive lower layer in the via at least between the conductive lower block and the phase change material.

4. The method of claim 1, further comprising forming a reentrant profile of the via prior to the deposition of the insulating spacer layer.

5. The method of claim 4, wherein forming the reentrant via profile includes:
- forming a first insulating layer over the conductive lower block;
- forming a second insulating layer over the first insulating layer; and
- etching the first and second insulating layers such that the second insulating layer overhangs the first insulating layer.

6. The method of claim 1, further comprising depositing insulating material above the conductive lower block and in the via, the insulating material being thicker than the radius of the via.

7. The method of claim 6, wherein the formation of the step spacer is performed such that the cavity of the step spacer along a center axial cross section of the step spacer is substantially T-shaped.

8. The method of claim 1, further comprising:
- recessing the phase change material into the via; and
- depositing a heat-isolating conductive upper layer between at least the phase change material and the conductive upper block.

* * * * *